United States Patent
Braun

[11] Patent Number: 6,052,005
[45] Date of Patent: Apr. 18, 2000

[54] LOW CURRENT DRAIN SWITCH INTERFACE CIRCUIT

[75] Inventor: Jeffrey J. Braun, Tempe, Ariz.

[73] Assignee: Motorola, Inc., Schaumburg, Ill.

[21] Appl. No.: 08/787,511

[22] Filed: Jan. 21, 1997

[51] Int. Cl.[7] ................................................ H03L 7/00
[52] U.S. Cl. ............................................ 327/143; 327/79
[58] Field of Search ...................... 327/319, 321, 327/327, 313, 333, 320, 143, 77, 78, 79, 80, 81, 91, 478, 108, 109, 112

[56] References Cited

U.S. PATENT DOCUMENTS

| | | | |
|---|---|---|---|
| 3,710,145 | 1/1973 | Williamson et al. | 327/478 |
| 3,795,824 | 3/1974 | Monahan | 327/491 |
| 3,867,649 | 2/1975 | Cochran | 327/111 |
| 3,882,328 | 5/1975 | Mazgy et al. | 307/237 |
| 4,066,916 | 1/1978 | King et al. | 327/478 |
| 4,461,963 | 7/1984 | Koomen | 307/279 |
| 4,520,278 | 5/1985 | De Roo | 327/478 |
| 4,580,293 | 4/1986 | Reichle | 359/180 |
| 4,744,369 | 5/1988 | Kroll | 128/696 |
| 5,146,476 | 9/1992 | Whitehead et al. | 375/98 |
| 5,157,282 | 10/1992 | Ong et al. | 326/27 |
| 5,258,669 | 11/1993 | Nakashima | 307/530 |
| 5,432,817 | 7/1995 | Hormel et al. | 375/257 |

*Primary Examiner*—Timothy P. Callahan
*Assistant Examiner*—An T. Luu
*Attorney, Agent, or Firm*—Gary J. Cunningham

[57] ABSTRACT

A low current drain switch interface circuit includes an input terminal (105), coupled to a first terminal (201) of a diode (115). A voltage follower circuit (211) is coupled to a second terminal (203) of the diode (115). A current source (215) is coupled between an output terminal (213) of the voltage follower circuit (211) and a power supply terminal (111). A mechanical switch (101) is coupled to the input terminal (105). The voltage follower circuit (211) outputs a voltage (119) indicative of a physical state of the mechanical switch (101).

10 Claims, 1 Drawing Sheet

LOW CURRENT DRAIN SWITCH INTERFACE CIRCUIT

FIELD OF THE INVENTION

This invention is related to the field of electronic modules that interface to mechanical switches.

BACKGROUND OF THE INVENTION

Contemporary electronic control modules often need to interface with mechanical switches. In automotive applications, the switch interface circuits applied in these electronic control modules have many difficult specifications to meet. For instance, when a vehicle is powered off via an ignition switch, certain electronic systems must still be operative. An example of this is a electronic control module that senses a door lock switch. Since the electronic control module must sense an unlocking of the door lock switch, the module needs to be powered while the vehicle is powered off. This requires that the electronic control module, and its switch interface circuitry associated with sensing the door lock switch, must operate at a very low current so as not to deplete the vehicle's battery while the vehicle is not in use. This low current requirement becomes even more relevant when the electronic control module must interface to many switches as is the case in automotive applications.

Furthermore, the switch interface circuitry must be able to withstand an overvoltage condition known as load dump which is associated with an improperly working battery charging system. While typically operating at a relatively low voltage of typically 12 volts, the electronic control module, and its switch interface circuit, must withstand a load dump voltage of over 60 volts without being destroyed.

Also, since electronic control modules are often assembled at an automobile assembly plant, and are capable of being exchanged in the field at a garage facility, the electronic control module and its switch interface circuit must withstand a reverse battery hookup condition common in mis-installation situations.

Additionally, the switch interface circuit portion of the electronic control module must operate while powered over a relatively wide operating voltage, typically ranging from below 5.5 volts and over 14 volts, while maintaining accurate switch sensing.

FIG. 1 shows a typical prior art switch interface circuit 100 in an automotive control module application. A door lock switch 101 is connected in a high-side configuration between a voltage source 103 and the switch interface circuit 100. The voltage source 103 is provided directly from a vehicle's battery. This voltage source 103 can range in amplitude from 5.5 volts when the vehicle's battery is either heavily loaded, such as it is during a cold crank condition, or substantially depleted, to more than 14 volts when the vehicle's alternator is charging the battery.

The door lock switch 101 is connected to the switch interface circuit 100 through an input terminal 105. The input terminal 105 is connected to a resistive divider comprising resistors 107 and 109. Resistor 107 is also connected to a clamp diode 115 that is connected to a voltage terminal 117 which also powers a comparator 113.

The comparator 113 outputs a voltage at a terminal 119 indicative of the physical state of the door lock switch 101. When the door lock switch 101 is in a closed position, the voltage source 103, through the resistors 107 and 109, cause the comparator 113 to output a switch closed state. Resistor 109 is also connected to a ground terminal 111, and is used to guarantee current flow to a ground state into the comparator 113 when the door lock switch 101 is in an open condition. This open condition causes the comparator 113 to output a switch open state.

The connected junction of the resistor 107, the resistor 109, and the clamp diode 115 is connected to an input of the comparator 113. The clamp diode 115 is in place to prevent an over-voltage condition, such as the earlier-mentioned load dump from destroying the comparator 113. The clamp diode 115 acts to limit any input voltage present at the input terminal 105 (which can exceed 60 volts as mentioned earlier) to a voltage present at the voltage terminal 117, which is typically 5 volts. The resistor 107 acts to limit current flow through the clamp diode 115 so as not to over burden a power supply regulator 121 driving the voltage terminal 117. Typically power supply regulators are not adept at sinking current as is the need when the current flows through the clamp diode 115. Additional regulator circuitry is often necessary when relatively low regulator load currents and relatively high clamp diode clamp currents coexist.

Note that the voltage source 103 has a significant amount of electrical noise emanating from it. In other words there is a significant amount of alternating current signal present on the underlying direct current voltage provided at the voltage source 103. Sources that contribute to the noise include transient loading of the vehicle's charging system that does occur when the vehicle is being started, when an air conditioning compressor turns on or off, and electromagnetic ignition generated noise, to name a few. This noise gets injected through resistor 107 and clamp diode 115 onto the voltage terminal 117. Since the voltage terminal 117 is directly connected to the comparator 113, if the noise exceeds the voltage output from the power supply regulator 121, the noise will be injected into an affect the operation of the comparator 113. Furthermore, the noise will be injected into the power supply regulator 121 and all other circuits connected to the power supply regulator 121. This can cause a lot of problems in electronic control modules because the power supply regulator 121 is usually connected to many circuits in the electronic control module.

Additional concerns with the prior art circuit shown in FIG. 1 include field reliability, compactness, and ease of manufacture. Ideally, to be reliable the number of discrete components should be reduced significantly. One approach to achieve these goals is to integrate the discrete components onto a silicon based circuit. Unfortunately, resistor 109 is typically made to have a relatively large resistance. Silicon integration of large resistances not only takes a significant amount of physical space, but the ability to repeatably fabricate a particular large resistance value is not practical in a silicon embodiment.

What is needed is an improved switch interface that has low current drain, is able to withstand an overvoltage condition, can withstand a reverse battery hookup condition, is not affected by relatively large amounts of noise injected, is reliable, compact, easy to manufacture, and accurately sense switch position.

DETAILED DESCRIPTION OF A PREFERRED EMBODIMENT

A low current drain switch interface circuit includes an input terminal coupled to a first terminal of a diode. The diode is used to block a reverse battery hookup condition. A voltage follower circuit is coupled to a second terminal of the diode. The voltage follower circuit acts to withstand an overvoltage condition. A current source is coupled between an output terminal of the voltage follower circuit and a power supply terminal. A mechanical switch is coupled to the input terminal. The voltage follower circuit outputs a voltage indicative of a physical state of the switch.

Figure 2:
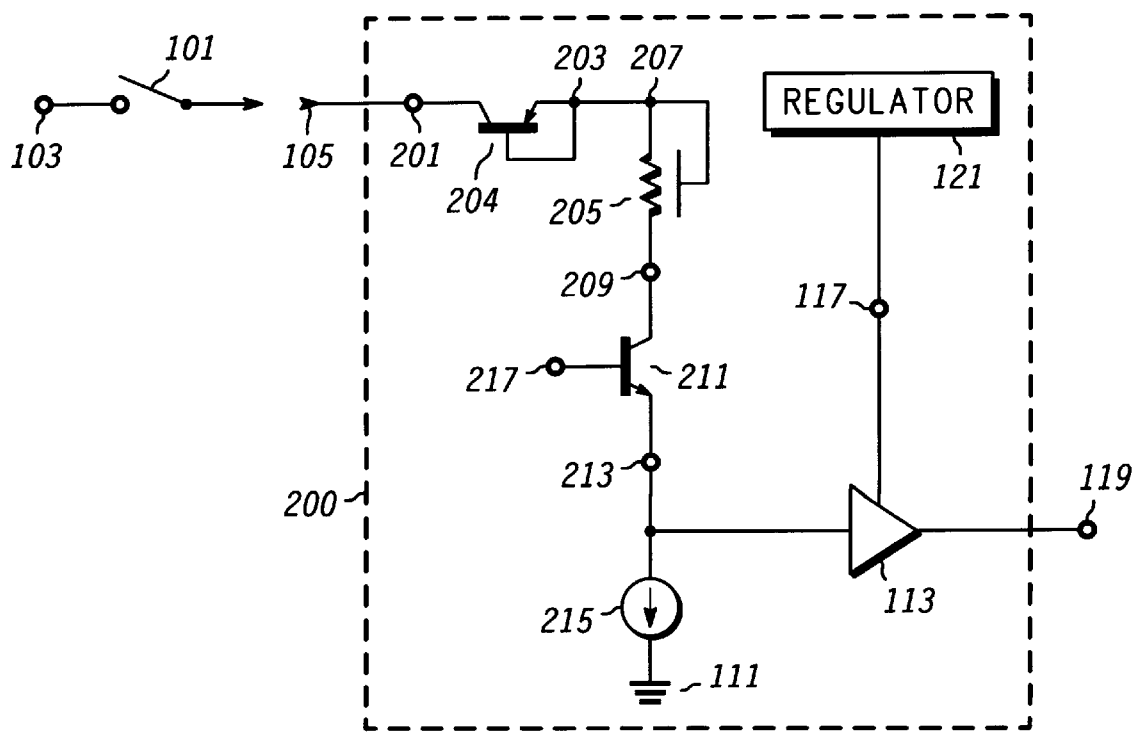
FIG. 2 is a schematic diagram of a switch interface circuit in accordance with an embodiment of the invention.

Turning to FIG. 2, an improved low current drain switch interface circuit is shown contained on an integrated circuit 200. The integrated circuit 200 has an input terminal or pin 105 coupled to an emitter terminal 201 of a PNP-type transistor 204. The PNP-type transistor 204 is configured as a diode that is used to protect the integrated circuit 200 from a reverse battery hookup condition.

A resistive device, here a diffused resistor 205, has a first terminal 207 connected to the collector-base terminal 203 of the PNP-type transistor 204. The purpose of the diffused resistor 205 is to compensate for a change in voltage drop across the PNP-type transistor 204 over temperature. A voltage drop measurable across the emitter to collector-base silicon junction of the PNP-type transistor 204 will decrease in a predictable manner with an increase in temperature. Depending on the physical structure of the actual PNP-type transistor 204, this change in voltage drop is typically between minus 1.8 millivolts/° C. to minus 2.4 millivolts/° C. In this embodiment the voltage drop minus 1.8 millivolts/° C. To negate the effect of this decreasing voltage drop with an increasing temperature the diffused resistor 205 must have a positive temperature coefficient. In the preferred embodiment, the temperature coefficient of the diffused resistor 205 is 5,800 parts per million, and the resistance of the diffused resistor 205 is 80,000 ohms. Both the resistor's temperature coefficient and the resistor's resistance effect the negation of the decreasing voltage drop with an increasing temperature effect produced by the PNP-type transistor 204. Of course, other resistor values and temperature coefficients would be needed to compensate for other forward voltage drop changes vs. temperature of the PNP-type transistor 204.

Of course, if the voltage drop error caused by the PNP-type transistor 204 over temperature is considered negligent, as it may be in some applications, the diffused resistor 205 can be eliminated.

Figure 1:
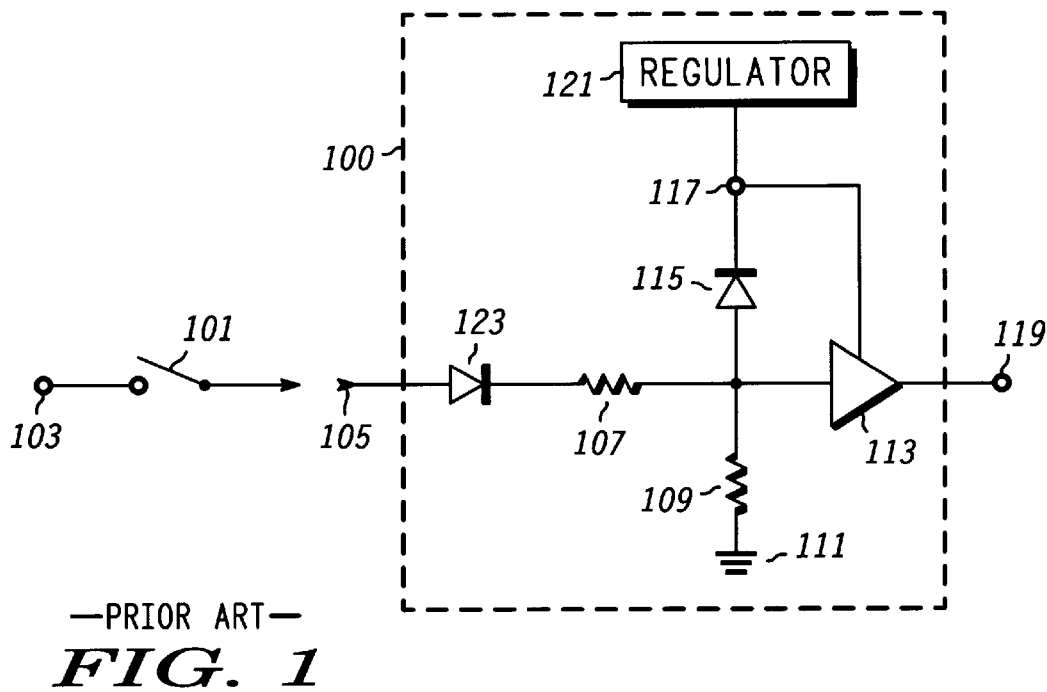
FIG. 1 is a schematic diagram of a prior art switch interface circuit.

An NPN-type transistor voltage follower 211 is connected to a second terminal 209 of the diffused resistor 205. The purpose of the NPN-type transistor voltage follower 211 is to act as a voltage follower until it clamps the input voltage, if the input voltage exceeds a voltage at an input terminal 217. Preferably, the input terminal 217 is connected to the voltage terminal 117, driven by the power supply regulator 121. Given this arrangement, any excessive input voltage, be it from a load dump, or from a noise disturbance injected into the input terminal 105 from the voltage source 103, will be prevented from flowing into the comparator 113, and/or the power supply regulator 121. So, the advantage of the NPN-type transistor voltage follower 211 structure is that it protects the comparator 113 from an overvoltage condition, while not allowing injection of overvoltage related noise, or other overvoltage related disturbance into the power supply regulator 121. This latter performance characteristic provides a significant improvement when compared to the prior art approach shown in FIG. 1, because the power supply regulator 121, and any loads driven by it are not disturbed by any overvoltage related disturbances.

A current source 215 is connected between an output terminal 213 of the NPN-type transistor voltage follower 211 and a power supply pin 111, in this configuration circuit ground. Significantly, the current source 215 in-effect replaces the function of the resistor 109 in the prior art circuit presented in FIG. 1. Advantageously, the current source 215 can be easily integrated onto a silicon circuit. Further, the relatively low current loading of a large resistor can be achieved by biasing the current source 215 to sink a relatively small amount of current—say 10 microamps. The current source structure provides a significant improvement when compared to the prior art approach shown in FIG. 1, because accuracy, manufactured repeatability, and small physical size of the current source are all easily achievable.

A voltage comparator 113 is connected to the output terminal 213 of the NPN-type transistor voltage follower 211. Here, the voltage comparator 113 is designed to switch output states at an input voltage of 3.3 volts. Of course, the voltage comparator 113 could be designed to switch output states at a different input voltage.

A mechanical switch 101 is coupled to the input terminal 105. The voltage follower circuit 211 outputs a voltage 119 indicative of a physical state of the mechanical switch 101. The voltage comparator 113 outputs a voltage at a terminal 119 indicative of the physical state of the door lock switch 101. When the door lock switch 101 is in a closed position, the voltage source 103, casues the comparator 113 to output a switch closed state. Given the accuracy accorded this design by elements 204, 205, and 215, the switch interface circuit of the integrated circuit 200 is far more accurate, compact, reliable, and easier to manufacture than prior art schemes. Furthermore, the current source 215 structure allows for a very low current drain circuit. This very low current drain is vital in certain applications, particularly in an automotive application, so as not to deplete the vehicle's battery while the vehicle is not in use.

Concerning alternative components, a conventional two-terminal diode can be substituted for the PNP-type transistor 204. In the circuit 200 shown, the emitter, or first terminal 201 would be replaced by an anode terminal of the diode, and a cathode terminal of the diode would replace the collector-base terminal 203 of the PNP-type transistor 204.

Also, the NPN-type transistor voltage follower 211 could be replaced by another type of voltage follower, such as a Field Effect Transistor (FET) type voltage follower, or a multi-transistor type device, as long as the voltage follower limits the voltage applied to the comparator.

The diffused resistor 205 could be either eliminated completely (if the temperature effect of the changing forward voltage drop across the diode structure of the PNP-type transistor 204 is considered negligent), or be replaced by another type of resistive device, or other circuit that effectively cancels the changing forward voltage drop across the diode structure of the PNP-type transistor 204.

The application shown here applies to a high-side driven switch interface circuit 200. Those skill in the art can easily transform this structure into a low-side driven configuration.

In summary an improved switch interface has been described. The switch interface structure shown has a very low current drain, is able to withstand an overvoltage condition, can withstand a reverse battery hookup condition, is not affected by relatively large amounts of noise injected, is reliable, compact, easy to manufacture, and accurately senses switch position.

What is claimed is:

1. A low current drain switch interface circuit comprising:
    an input terminal;
    a diode having a first terminal coupled to the input terminal, and a second terminal;

a resistive device having a first terminal coupled to the second terminal of the diode, and a second terminal;

a voltage follower circuit coupled to the second terminal of the resistive device, the voltage follower circuit having an output terminal;

a power supply terminal; and a current source coupled between the output terminal of the voltage follower circuit and the power supply terminal.

2. A circuit in accordance with claim 1 further comprising a comparator coupled to the output terminal of the voltage follower circuit.

3. A circuit in accordance with claim 1 wherein the first terminal of the diode corresponds to an anode terminal, and the second terminal of the diode corresponds to a cathode terminal.

4. A low current drain switch interface circuit comprising:

an input terminal;

a diode having a first terminal coupled to the input terminal, and a second terminal;

a voltage follower circuit coupled to the second terminal of the diode, the voltage follower circuit having an output terminal;

a power supply terminal;

a current source coupled between the output terminal of the voltage follower circuit and the power supply terminal;

a voltage source; and a switch coupled between the voltage source and the input terminal, wherein the current source provides current flow from the voltage source, through the switch, through the diode, through the voltage follower circuit, to the power supply terminal.

5. A circuit in accordance with claim 1 wherein the voltage follower circuit comprises a field effect transistor.

6. A low current drain switch interface circuit comprising:

an input terminal;

a diode having a first terminal coupled to the input terminal, and a second terminal;

a resistive device having a first terminal coupled to the second terminal of the diode, and a second terminal;

a voltage follower circuit coupled to the second terminal of the resistive device, the voltage follower circuit having an output terminal;

a power supply terminal;

a current source coupled between the output terminal of the voltage follower circuit and the power supply terminal; and a comparator coupled to the output terminal of the voltage follower circuit.

7. A circuit in accordance with claim 6 wherein the resistive device comprises a diffused resistor.

8. A circuit in accordance with claim 6 wherein the first terminal of the diode corresponds to an anode terminal, and the second terminal of the diode corresponds to a cathode terminal.

9. A circuit in accordance with claim 6 further comprising:

a voltage source; and a switch coupled between the voltage source and the input terminal, wherein the current source provides current flow from the voltage source, through the switch, through the diode, through the resistive device, through the voltage follower circuit, to the power supply terminal.

10. A low current drain switch interface circuit contained on an integrated circuit comprising:

an input pin;

a PNP-type transistor with an emitter terminal connected to the input pin, and a collector-base terminal;

a diffused resistor having a first terminal connected to the collector-base terminal of the PNP-type transistor, and a second terminal;

an NPN-type transistor voltage follower connected to the second terminal of the diffused resistor, the NPN-type transistor voltage follower having an output terminal;

a power supply pin;

a current source connected between the output terminal of the NPN-type transistor voltage follower and the power supply pin; and a voltage comparator connected to the output terminal of the NPN-type transistor voltage follower.

* * * * *